United States Patent
Rhee et al.

(10) Patent No.: US 6,734,528 B2
(45) Date of Patent: May 11, 2004

(54) TRANSISTOR WITH PI-GATE STRUCTURE AND METHOD FOR PRODUCING THE SAME

(76) Inventors: Jin-Koo Rhee, 26, Pil-Dong 3GA, Jung-Gu, c/o Dongkuk University, Seoul 100-715 (KR); Hyun-Sik Park, 26, Pil-Dong 3GA, Jung-Gu, c/o Dongkuk University, Seoul 100-715 (KR); Dan An, 26, Pil-Dong 3GA, Jung-Gu, c/o Dongkuk University, Seoul 100-715 (KR); Yeon-Sik Chae, 26, Pil-Dong 3GA, Jung-Gu, c/o Dongkuk University, Seoul 100-715 (KR)

( * ) Notice: Subject to any disclaimer, the term of this patent is extended or adjusted under 35 U.S.C. 154(b) by 477 days.

(21) Appl. No.: 09/755,436

(22) Filed: Jan. 4, 2001

(65) Prior Publication Data

US 2002/0063293 A1 May 30, 2002

(30) Foreign Application Priority Data

Nov. 27, 2000 (KR) .......................................... 2000-70982

(51) Int. Cl.$^7$ .............................................. H01L 29/40
(52) U.S. Cl. ........................ 257/621; 257/774; 257/346; 257/192
(58) Field of Search ................................ 257/621, 192, 257/774, 346

(56) References Cited

U.S. PATENT DOCUMENTS

| 4,974,039 A | * 11/1990 | Schindler et al. ............. 257/277 |
| 6,072,214 A | 6/2000 | Herzer et al. ................. 257/331 |

FOREIGN PATENT DOCUMENTS

| EP | 0 926 727 A1 | 6/1999 | ....... H01L/21/8234 |
| WO | WO 98/53491 | 11/1998 | ......... H01L/21/336 |
| WO | WO 00/52760 | 9/2000 | ........... H01L/29/78 |

* cited by examiner

Primary Examiner—John B. Vigushin
Assistant Examiner—Luan Thai
(74) Attorney, Agent, or Firm—Lee, Hong, Degerman, Kang & Schmadeka

(57) ABSTRACT

The present invention discloses an improved transistor with a π-gate structure usable at microwave and millimeter wave and comprises a GaAs wafer, GND formed on the bottom surface of the wafer and grounded to source layers formed on the top surface of the wafer by the process of back-side via-hole. A drain is formed on the top surface of the wafer between the source layers and has an air layer on top. A gate, shaped as a result of using an air bridge technique, contacts the top surface of the wafer between the source layers and the drain so as to support the wafer at laterally opposite ends over the air layer of the drain. The gate having π-structure improves noise characteristics of the transistor because of low electrical resistance, which is a result of the gate structure straddling above the drain stage.

5 Claims, 2 Drawing Sheets

TRANSISTOR WITH PI-GATE STRUCTURE AND METHOD FOR PRODUCING THE SAME

FIELD OF THE INVENTION

The present invention relates to a transistor with π-gate structure usable at microwave and millimeter wave and a method for producing the same.

BACKGROUND OF THE INVENTION

Conventional extra-high speed transistors were manufactured to have T-gate structure in order to increase the cross section of gates. However, there was a limit in increasing the cross section under the restriction of source-drain spacing. However, the present inventors found that the production of gates with very large cross section without the restriction of the source-drain spacing is possible, by employing an air bridge technique in which the gate is manufactured beyond the drain electrode to result in π-structure, whereby the characteristic of the transistor is remarkably improved.

SUMMARY OF THE INVENTION

The present invention proposes the structure of a transistor having a gate of very large cross section and a method for manufacturing the same and so the object of the invention is to improve the noise factor and frequency characteristic of a circuit by decreasing the gate resistance in the transistors for microwave and millimeter wave.

The invention is also intended to improve the performance of a wireless communications system through the improvement in the characteristics of unit elements and circuits.

DETAILED DESCRIPTION OF THE INVENTION

A preferred embodiment of the method for manufacturing a transistor with π-gate structure and a transistor so produced according to the invention is described in detail by referring to the accompanying drawings.

Figure 2:
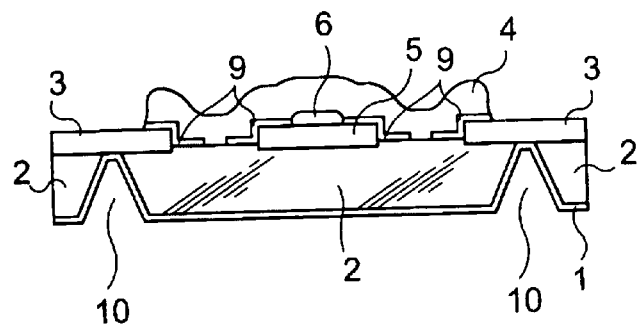

In a transistor shown in FIG. 2, it is seen that a GaAs wafer 2 is formed on the bottom with GND 1, which is grounded to source layers 3 formed on the top surface of the GaAs wafer 2 by the process of back side via-hole 10. Between the source layers 3 there is formed a drain 5, the top part of which has an air layer 6. As the result of using the air bridge technique, a gate 4 is shaped such that it contacts the top surface of the GaAs wafer 2 between the source layers 3 and the drain 5 and so supports both sides of the wafer over the opening or air layer 6 of the drain 5, resulting in a gate having π-structure.

The manufacturing method of gate with π-structure by using an air bridge technique comprises:

the step of vapor-depositing, on a wafer 2, to form a drain 5 and source layers 3 of Ti/Au as the primary metal layers in the thickness of 200 Å/4000 Å through PHEMT process;

the step of forming silicon nitride film 9 in the thickness of 1000 Å, patterning the formed silicon nitride film 9 by using an electron beam exposure device, forming gate foot steps by etching the film, and then conducting HMDS coating by PR-via pattern forming process using the positive photo irradiation drawing process, conducting AZ1518 coating at 2000 rpm for 20 seconds, conducting soft-baking at 98° C. for 45 seconds, aligning patterns, conducting UV exposure and developing for 1 minute and 30 seconds, and subsequently conducting a hard-baking at 115° C. for 4 minutes and 30 seconds to thereby harden the resist 7;

the step of forming, by vapor-depositing, a thin gold film 8 in the thickness of about 250~300 Å on the surface of GaAs wafer 2;

the step of conducting HMDS coating after forming secondary metal patterns 7a by using an image inversion process, conducting AZ5214E coating at 2000 rpm for 10 seconds, conducting soft-baking at 98° C. for 45 seconds, aligning patterns, and then conducting free exposure for 7 seconds, reverse baking at 110° C. for 50 seconds and plot exposure for 25 seconds before development;

the step of disconnecting the source 3 and drain 5 by etching off the exposed gold film 8 by using the metal etching solution consisting of N, KCN, $H_2O$ at the ratio of 10 ml:500 ml:100 ml, and thereafter forming a gate 4 in the thickness of 200 Å/8000 Å by vapor deposition of Ti/Au and attaining a finished gate 4 with π-structure through lifting-off by means of acetone; and the step of performing the process of back side via-hole 10 on the wafer 2 to ground the GND 1 to the source layer 3.

Figure 1A:
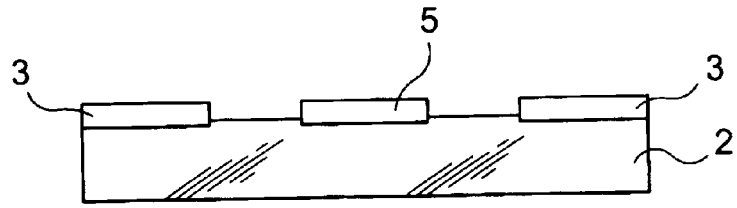
FIG. 1 shows the sequential procedure of manufacturing a transistor according to the invention and FIG. 2 shows the so manufactured transistor according to the invention.

The process for manufacturing a transistor having π-gate structure is described in some more detail by referring to FIG. 1:

As is shown in FIG. 1A, a drain 5 and source layers 3 of Ti/Au as the primary metal layers are formed by vapor deposition in the thickness of 200 Å/4000 Å on a wafer 2 through PHEMT process. Subsequently, silicon nitride film 9 is laminated in the thickness of 1000 Å to form gate foot steps.

Figure 1B:
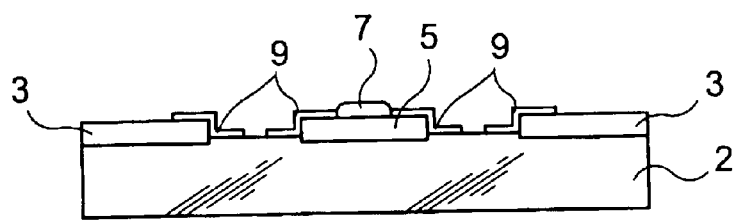

Then, as shown in FIG. 1B, the laminated silicon nitride film 9 is patterned by using an electron beam exposure device before forming gate foot steps by etching the nitride film. Then, the PR-via pattern forming process using the positive photo irradiation drawing process is carried out, wherein after HMDS coating, AZ1518 coating is conducted at 2000 rpm for 20 seconds, and soft-baking at 98° C. is subsequently conducted for 45 seconds, patterns are aligned, UV exposure and developing are performed for 1 minute and 30 seconds, and lastly a hard-baking at 115° C. for 4 minutes and 30 seconds follows to thereby harden the resist 7.

Figure 1C:
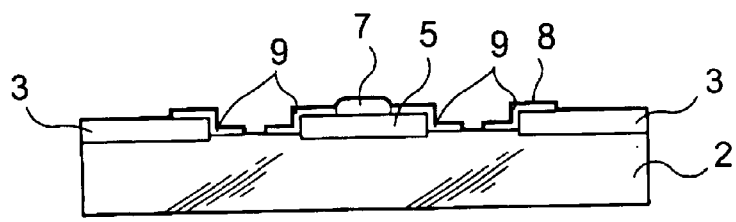

As the next step, as in FIG. 1C, by vapor-depositing, a thin gold film 8 is formed in the thickness of about 250~300 Å on the surface of GaAs wafer 2 to prevent the resist 7 for PR-via from being developed at the time of patterning the secondary metal. At this time, the thickness of the thin gold film 8 is chosen to be minimum so as not to influence the process, because too large a thickness makes it difficult not only to align the patterns but also to lift off the bridge metal after it has been vapor-deposited, while too small a thickness even the portion of the resist 7 that should not be developed tends to be developed in the pattern forming process.

Figure 1D:
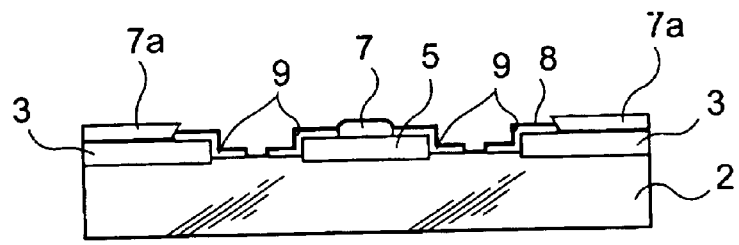
Figure 1E:
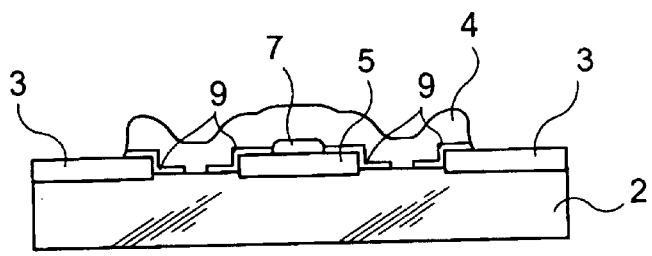
Figure 1F:
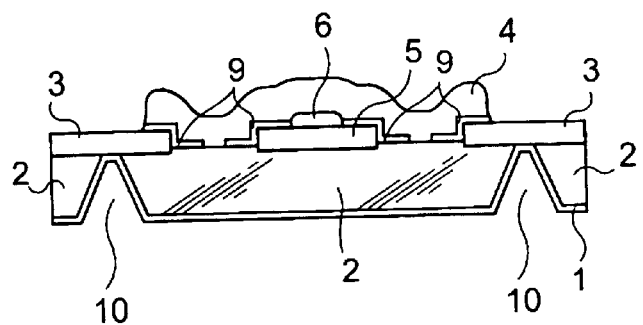

After having gone through the above steps, as shown in FIG. 1D, the process of forming secondary metal patterns 7a by using an image inversion process is conducted, wherein after coating HMDS, AZ5214E coating is conducted at 2000 rpm for 10 seconds, soft-baking is conducted at 98° C. for 45 seconds followed by pattern alignment, and then free exposure for 7 seconds, reverse baking at 110° C. for 50 seconds and plot exposure for 25 seconds are sequentially performed before development;

In the next step as shown in FIG. 1E in which a gate 4 is formed in the thickness of 200 Å/8000 Å by vapor deposition of Ti/Au, lifting-off by means of acetone has been conducted to form the air layer 6 so that the bridge manufacture is completed, the step of disconnecting the source 3 and drain 5 by etching off the exposed gold film 8 by using the metal etching solution consisting of N, KCN, H$_2$O at the ratio of 10 ml:500 ml:100 ml was conducted beforehand.

As the final step, the process of back side via-hole 10 is performed on the wafer 2 to ground the GND 1 to the source layer 3.

It is to be understood that, while the invention was described with respect to respective preferable specific embodiments, the invention is not restricted to those embodiments and a variety of modifications and alterations would be possible to a man skilled in the art by referring to the description or drawings presented here and within the spirit of the invention and thus those modifications or alterations are to fall within the scope of the invention, which scope should be limited only by the attached claims.

What is claimed is:

1. A transistor comprising:

a substrate having top and bottom surfaces;

first and second source layers over the top surface of the substrate;

a GND layer formed on the bottom surface of the substrate and grounded to the first and second source layers by way of a back-side via-hole process;

a drain formed on the top surface of the substrate between the first and second source layers, an air layer formed over the drain;

first and second gate footsteps formed between the first and second source layers and the drain; and a metal layer having a π structure formed using an air bridge technique over the top surface of the substrate so as to contact the substrate at the first and second gate footsteps between the first and second source layers and the drain, thereby forming a gate and laterally supporting opposite ends of the substrate over the air layer.

2. The transistor of claim 1, wherein the substrate comprises gallium arsenide.

3. The transistor of claim 1, wherein the air layer is formed over the drain by means of acetone lifting-off of the metal layer.

4. The transistor of claim 1, wherein the metal layer is formed by way of vapor deposition.

5. The transistor of claim 1, wherein the metal layer comprises Ti/Au.

* * * * *